(12) United States Patent
Liaw

(10) Patent No.: US 10,748,902 B2
(45) Date of Patent: *Aug. 18, 2020

(54) FIN-BASED DEVICE HAVING AN ISOLATION GATE COMPRISING A CONFORMAL DIELECTRIC LAYER AND A METAL GATE

(71) Applicant: Taiwan Semiconductor Manufacturing Company, Ltd., Hsin-Chu (TW)

(72) Inventor: Jhon Jhy Liaw, Hsinchu County (TW)

(73) Assignee: TAIWAN SEMICONDUCTOR MANUFACTURING COMPANY, LTD., Hsin-chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/218,578

(22) Filed: Dec. 13, 2018

(65) Prior Publication Data

US 2019/0115349 A1 Apr. 18, 2019

Related U.S. Application Data

(60) Continuation of application No. 15/784,335, filed on Oct. 16, 2017, now Pat. No. 10,170,480, which is a
(Continued)

(51) Int. Cl.
*H01L 27/092* (2006.01)
*H01L 29/06* (2006.01)
(Continued)

(52) U.S. Cl.
CPC .... *H01L 27/0924* (2013.01); *H01L 21/28079* (2013.01); *H01L 21/28088* (2013.01);
(Continued)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS 8,609,510 B1 * 12/2013 Banna ............... H01L 29/66545
257/E21.409
8,878,309 B1 11/2014 Hong et al.
(Continued)

FOREIGN PATENT DOCUMENTS

CN 1538504 10/2004
KR 20110101408 9/2011
(Continued)

OTHER PUBLICATIONS

Korean Office Action issued in Korean Patent Application No. P20140214KR00 dated Nov. 11, 2016 with English Language Translation.
(Continued)

*Primary Examiner* — Younes Boulghassoul
(74) *Attorney, Agent, or Firm* — Haynes and Boone, LLP

(57) ABSTRACT

The present disclosure provides a semiconductor structure comprising one or more fins formed on a substrate and extending along a first direction; one or more gates formed on the one or more fins and extending along a second direction substantially perpendicular to the first direction, the one or more gates including an first isolation gate and at least one functional gate; source/drain features formed on two sides of each of the one or more gates; an interlayer dielectric (ILD) layer formed on the source/drain features and forming a coplanar top surface with the first isolation gate. A first height of the first isolation gate is greater than a second height of each of the at least one functional gate.

20 Claims, 14 Drawing Sheets

Related U.S. Application Data division of application No. 14/334,842, filed on Jul. 18, 2014, now Pat. No. 9,793,273.

(51) Int. Cl.

| | | |
|---|---|---|
| *H01L 29/49* | (2006.01) | |
| *H01L 29/51* | (2006.01) | |
| *H01L 29/66* | (2006.01) | |
| *H01L 29/165* | (2006.01) | |
| *H01L 21/8234* | (2006.01) | |
| *H01L 21/8238* | (2006.01) | |
| *H01L 21/28* | (2006.01) | |
| *H01L 21/306* | (2006.01) | |
| *H01L 21/308* | (2006.01) | |
| *H01L 21/762* | (2006.01) | |

(52) U.S. Cl.
CPC ...... *H01L 21/308* (2013.01); *H01L 21/30604* (2013.01); *H01L 21/76224* (2013.01); *H01L 21/823418* (2013.01); *H01L 21/823814* (2013.01); *H01L 21/823821* (2013.01); *H01L 21/823828* (2013.01); *H01L 21/823878* (2013.01); *H01L 29/0653* (2013.01); *H01L 29/495* (2013.01); *H01L 29/4966* (2013.01); *H01L 29/517* (2013.01); *H01L 29/6656* (2013.01); *H01L 29/66545* (2013.01); *H01L 29/165* (2013.01)

(58) Field of Classification Search
CPC ......... H01L 27/10826; H01L 27/10879; H01L 27/1211; H01L 29/41791; H01L 29/66795–66818; H01L 29/785–7856; H01L 2029/7857–7858; H01L 2924/13067; H01L 21/76224–76235; H01L 21/763; H01L 21/823878; H01L 21/823481; H01L 21/0653; H01L 21/0649; H01L 21/0642; H01L 29/66553; H01L 29/6656; H01L 21/28079; H01L 21/28088; H01L 21/823437; H01L 21/823456; H01L 21/823828; H01L 21/82385; H01L 29/66545
See application file for complete search history.

(56) References Cited

U.S. PATENT DOCUMENTS

| | | | |
|---|---|---|---|
| 8,916,460 B1 * | 12/2014 | Kwon | H01L 21/845 438/595 |
| 8,969,163 B2 * | 3/2015 | Aquilino | H01L 21/76232 257/374 |
| 9,117,910 B2 | 8/2015 | Jeong et al. | |
| 9,793,273 B2 | 10/2017 | Liaw | |
| 2007/0134884 A1 | 6/2007 | Kim et al. | |
| 2010/0001340 A1 | 1/2010 | Lee et al. | |
| 2012/0126336 A1 | 5/2012 | Anderson et al. | |
| 2013/0140639 A1 | 6/2013 | Shieh et al. | |
| 2013/0292777 A1 | 11/2013 | Liaw | |
| 2013/0328162 A1 | 12/2013 | Hu et al. | |
| 2014/0070320 A1 | 3/2014 | Mukherjee et al. | |
| 2014/0103452 A1 | 4/2014 | Chang et al. | |
| 2014/0151810 A1 | 6/2014 | Maeda et al. | |
| 2014/0374830 A1 * | 12/2014 | Jeong | H01L 29/7855 257/365 |
| 2015/0021710 A1 * | 1/2015 | Hsu | H01L 27/0886 257/401 |
| 2015/0206885 A1 * | 7/2015 | Barth, Jr. | H01L 27/10826 257/301 |
| 2015/0214341 A1 * | 7/2015 | Shin | H01L 29/785 257/401 |
| 2015/0325575 A1 * | 11/2015 | Park | H01L 29/165 257/401 |
| 2016/0020210 A1 | 1/2016 | Liaw | |
| 2016/0268392 A1 * | 9/2016 | Zhu | H01L 21/76224 |
| 2018/0040621 A1 | 2/2018 | Liaw | |

FOREIGN PATENT DOCUMENTS

| | | |
|---|---|---|
| KR | 20130139158 | 12/2013 |
| KR | 20150090796 | 8/2015 |
| TW | 201428976 | 7/2014 |

OTHER PUBLICATIONS

Decision of Refusal of Amendment Action submitted in Korean Patent Application No. P20140214KR00 dated Nov. 11, 2016 with English Language Translation.
Taiwan Office Action dated Aug. 2, 2016 for Application No. 104123052, 9 pages.
Korean Office Action dated Oct. 26, 2015 received in Patent Application No. 10-2014-0159872.

* cited by examiner

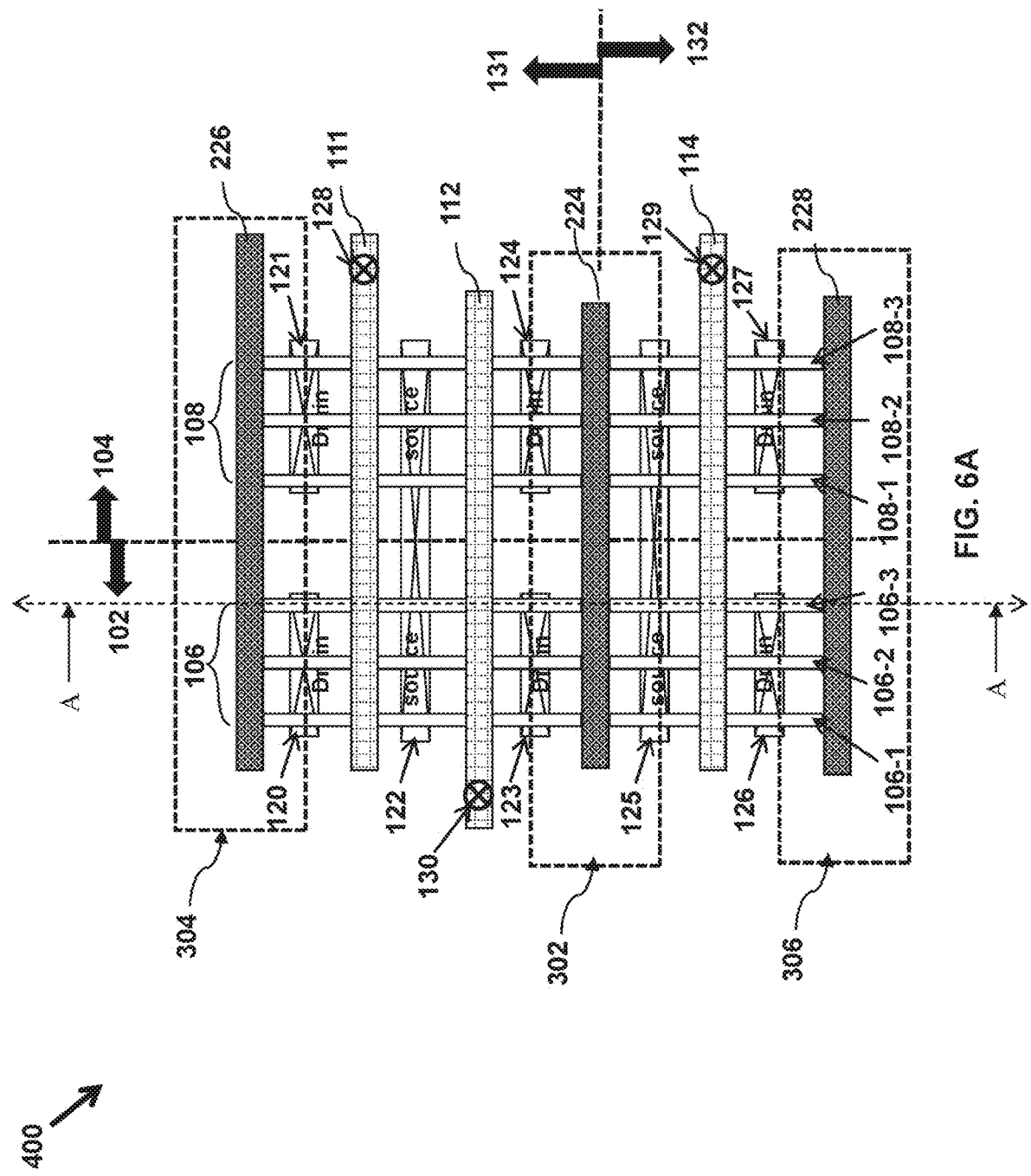

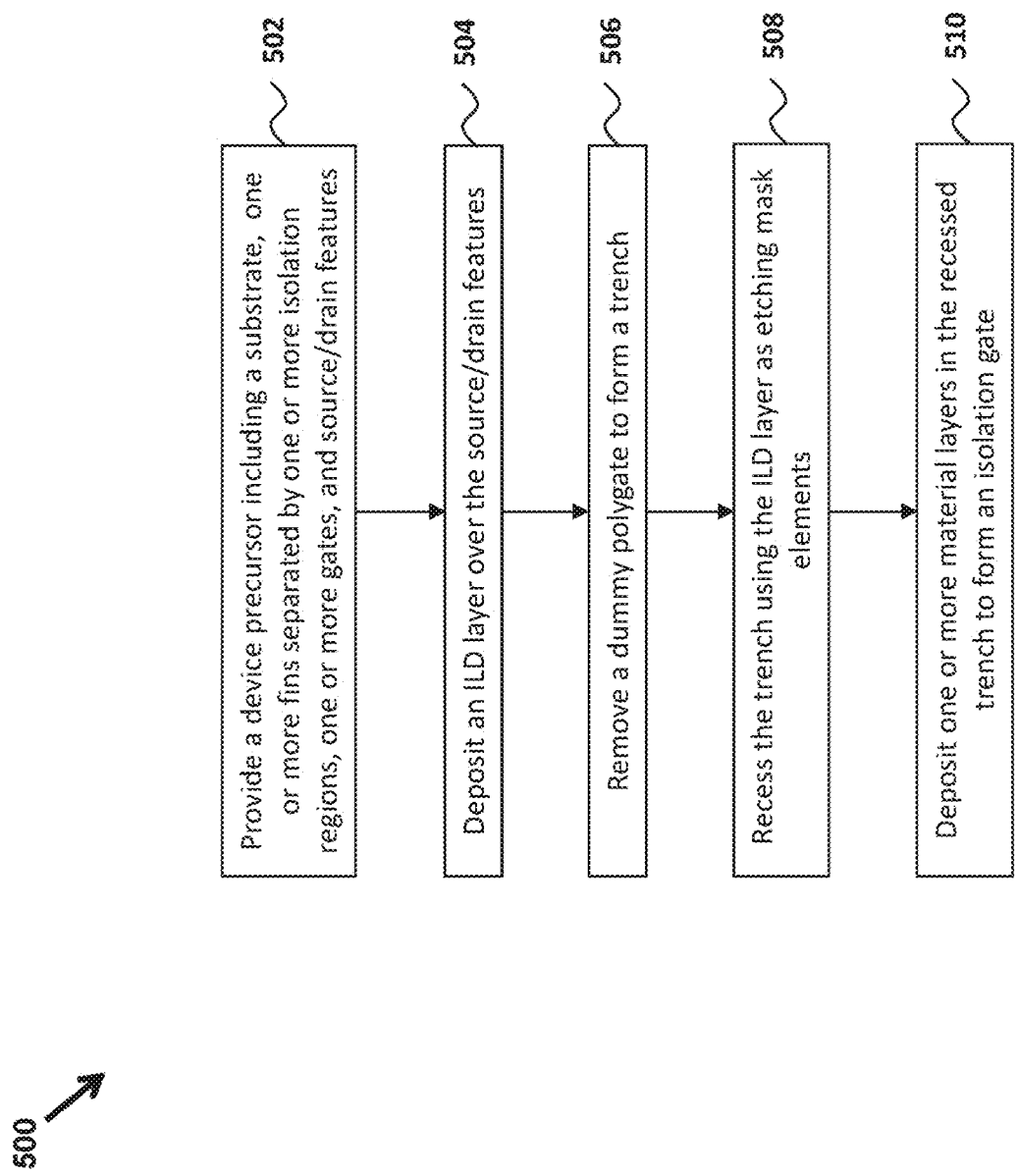

FIN-BASED DEVICE HAVING AN ISOLATION GATE COMPRISING A CONFORMAL DIELECTRIC LAYER AND A METAL GATE

The present application is a continuation of U.S. application Ser. No. 15/784,335, filed on Oct. 16, 2017, which is a divisional of U.S. application Ser. No. 14/334,842, filed on Jul. 18, 2014, each of which is hereby incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, has been introduced to replace a planar transistor. Although existing semiconductor devices and methods of fabricating semiconductor devices have been generally adequate for their intended purposes, they have not been entirely satisfactory in all respects. For example, to introduce three dimensional nanostructure to a gate channel raises challenges in a semiconductor device process development. It is desired to have improvements in this area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6A is a top view of a design layout of the FinFET device constructed according to some embodiments of the present disclosure.

FIG. 6B is a cross sectional view of the FinFET device along the line A-A in FIG. 6A according to some embodiments of the present disclosure.

FIG. 7 is a flow chart of an example method for fabricating the FinFET device according to various aspects of the present disclosure.

DETAILED DESCRIPTION

Figure 1A:
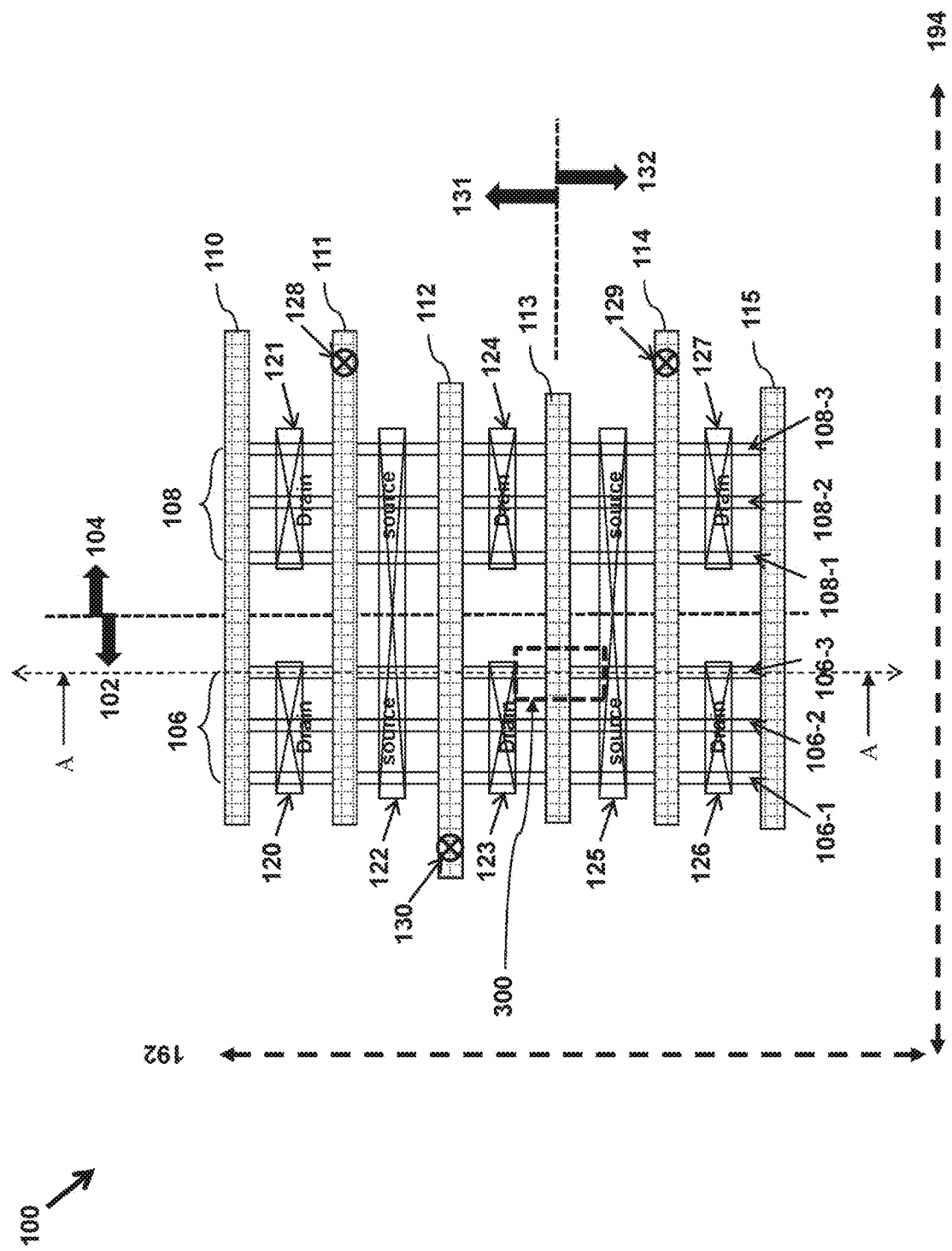
FIGS. 1A, 3A, 4A, and 5A are top views of a design layout of the FinFET device constructed at various fabrication stages according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to, but not otherwise limited to a metal-oxide-semiconductor field-effect transistor (MOSFET), for example a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with a FinFET example to illustrate various embodiments of the present invention. It is understood, however, that the application should not be limited to a particular type of device, except as specifically claimed.

FIG. 1A is a top view of a design layout 100 of the FinFET device constructed according to some embodiments of the present disclosure. As shown in FIG. 1A, the design layout 100 includes a PMOS region 102 and an NMOS region 104. The PMOS region 102 is formed in an n-well region, and the NMOS region 104 is formed in a p-well region. The PMOS region 102 may be configured on a first active region 106, and the NMOS region 104 may be configured on a second active region 108. As shown in FIG. 1A, the first active region 106 may include one or more active fin lines, e.g., fin lines 106-1, 106-2, and 106-3. Similarly, the second active region 108 may also include one or more active fin lines, e.g., fin lines 108-1, 108-2, and 108-3. The one or more fin lines are configured to extend along a first direction 192.

Referring to FIG. 1A, one or more gates 110-115 are configured to extend along a second direction 194 and formed on the first active region 106 and the second active region 108. The one or more gates 110-115 may be configured to be parallel to each other. The second direction 194 may be substantially perpendicular to the first direction 192. In some embodiments, the one or more gates may be configured with the active regions to form one or more corresponding pull-up (PU) device, pull-down (PD) devices, and pass-gate (PG) devices in a cell. As shown in FIG. 1A, the doped regions, e.g., sources and drains, of each gate may be electrically and physically connected to the doped regions of the adjacent gate. For example, the sources of the gate 111 may be electrically and physically connected to the sources of the gate 112 by sharing a common source region defined in the active regions and positioned between the gate 111 and the gate 112.

Still referring to FIG. 1A, various contacts 120-127 may be formed on the doped regions for electrically connecting the doped regions. For example, a contact 120 may be used to electrically connecting the doped drain region of the gate 110 to the doped drain region of the gate 111 in the first active region 106. A contact 121 may be used to electrically connecting the doped drain region of the gate 110 to the doped drain region of the gate 111 in the second active region 108. A contact 123 may be used to electrically connecting the doped drain region of the gate 112 to the doped drain region of the gate 113 in the first active region 106. A contact 124 may be used to electrically connecting the doped drain region of the gate 112 to the doped drain region of the gate 113 in the second active region 106. A contact 126 may be used to electrically connecting the doped drain region of the gate 114 to the doped drain region of the gate 115 in the first active region 104. A contact 127 may be used to electrically connecting the doped drain region of the gate 114 to the doped drain region of the gate 115 in the second active region 106.

One or more long contacts may be configured to extend along the second direction 194 and to extend over the first active region 106 and the second active region 108. The long contacts have a first dimension extending along the first direction 192 and a second dimension extending along the second direction 194, and the first dimension is substantially shorter than the second dimension. The one or more long contacts may be used to electrically connect the doped regions of two adjacent gates on both the first active region 106 and the second active region 108. For example, a long contact 122 may be used to electrically connect doped source regions of the gate 111 and the gate 112 extending over the first active region 106 and the second active region 108. A long contact 125 may be used to electrically connect doped source regions of the gate 113 and the gate 114 extending over the first active region 106 and the second active region 108.

One or more gate contacts 128-130 may also be formed on the corresponding gates for routing the gates to the metal routing lines (not shown) correspondingly. The metal routing lines may be formed in one or more metal layers (not shown) on the gates.

Still referring to FIG. 1A, the design layout 100 may include more than one circuit, e.g., a first circuit 131 and a second circuit 132. In some embodiments, an isolation feature, such as a dummy gate 113 may be formed between the first circuit 131 and the second circuit 132.

Figure 1B:
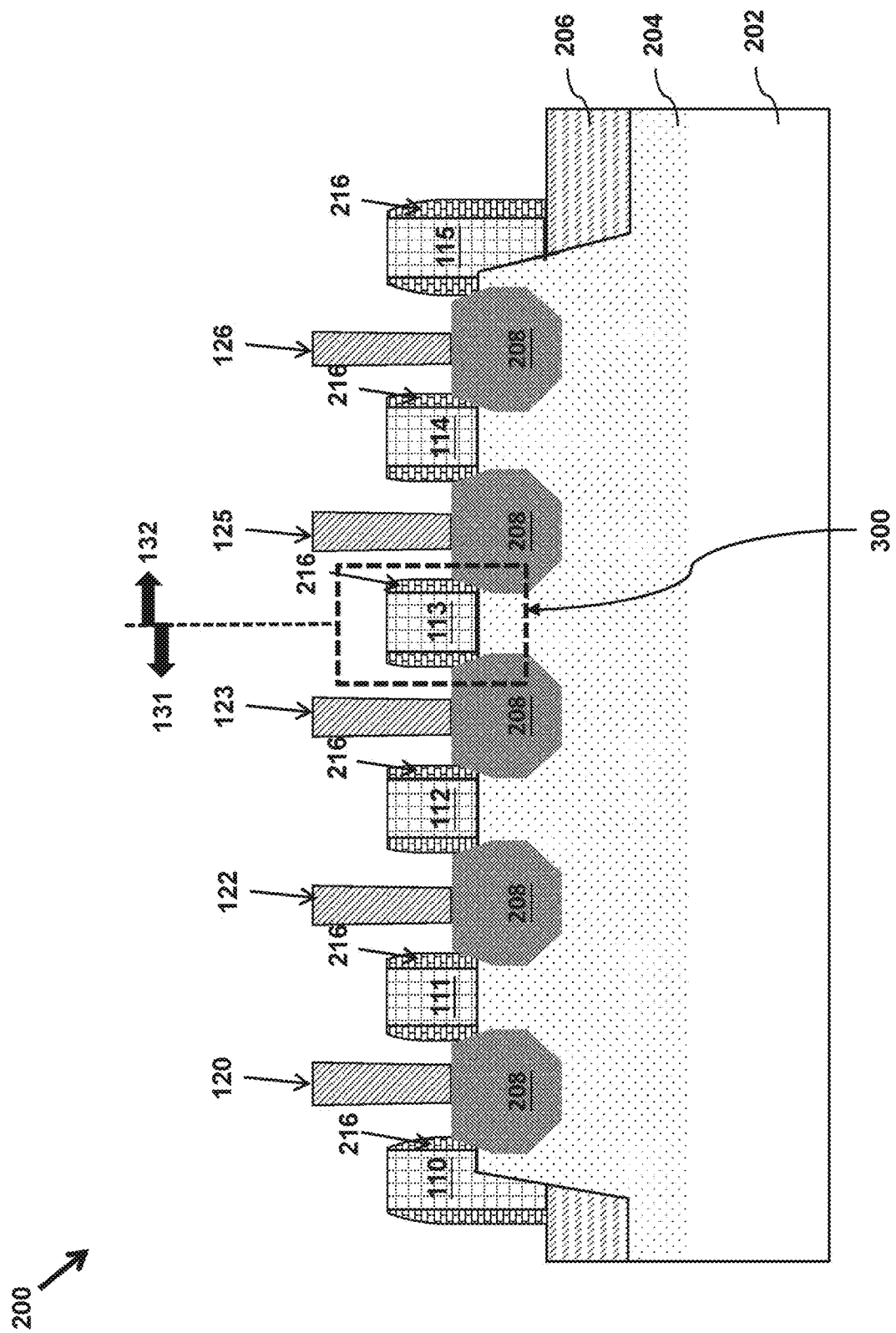
FIGS. 1B, 5B, and 6B are cross sectional views of the FinFET device along the line A-A in FIGS. 1A, 5A, and 6A respectively according to some embodiments of the present disclosure.

FIG. 1B is a cross sectional view of the FinFET device 200 along the line A-A in FIG. 1A according to some embodiments of the present disclosure. As shown in FIG. 1B, the FinFET device 200 includes a substrate 202. The substrate 202 may include bulk silicon (Si). Alternatively, an elementary semiconductor, such as silicon (Si) or germanium (Ge) in a crystalline structure, may also be included in the substrate 202. The substrate 202 may also include a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb), or combinations thereof. Possible substrate 202 may also include a semiconductor-on-insulator substrate, such as Si-on-insulator (SOI), SiGe-on-insulator (SGOI), Ge-on-insulator (GOI) substrates. For example, the SOI substrates may be fabricated using separation by implantation of oxygen (SIMOX), wafer bonding, and/or other suitable methods.

Referring to FIG. 1B, various doped regions 204 may also be included in the substrate 202 depending on design requirements. The doped regions may be doped with p-type dopants, such as boron (B) or boron fluoride (BF3). The doped regions may also be doped with n-type dopants, such as phosphorus (P) or arsenic (As). The doped regions may also be doped with combinations of p-type and n-type dopants. The doped regions may be formed directly on the substrate 202, in a p-well structure, in a n-well structure, in a dual-well structure, or using a raised structure.

Still referring to FIG. 1B, the FinFET device 200 may include one or more isolation regions 206. The one or more isolation regions 206 are formed over the substrate 202 to isolate active regions. For example, each isolation region 206 separates the adjacent doped regions 204 in the substrate 202 from each other. The one or more isolation regions 206 may be formed using traditional isolation technology, such as shallow trench isolation (STI), to define and electrically isolate the one or more active fins lines. In some examples, the isolation regions 206 may include silicon oxide, silicon nitride, silicon oxynitride, an air gap, other suitable materials, or combinations thereof. The isolation regions 206 may be formed by any suitable process. In some examples, the formation of an STI includes a photolithography process, etching a trench in the substrate 202 (for example, by using a dry etching and/or wet etching), and filling the trench (for example, by using a chemical vapor deposition process) with one or more dielectric materials to form the isolation regions 206. The filled trench may have a multi-layer structure such as a thermal oxide liner layer filled with silicon nitride or silicon oxide. A chemical mechanical polishing (CMP) process may then be performed to remove excessive dielectric materials and planarize the top surface of the isolation regions 206.

Referring to FIG. 1B, one or more gates 110-115 may be formed on the first active region 106, the second active region 108, and the doped regions 204. The one or more gates 110-115 may include functional gates and/or dummy polygates. For example, gate 113 may be a dummy polygate configured to isolate the circuit 131 and the circuit 132. The dummy polygate 113 may include polysilicon. Gates 110-112, and 114-115 may be functional gates. The one or more gates 110-115 may be formed by a procedure including depositing, lithography patterning, and/or etching processes. The deposition processes may include chemical vapor deposition (CVD), physical vapor deposition (PVD), atomic layer deposition (ALD), other suitable methods, and/or combinations thereof.

Still referring to FIG. 1B, sidewall spacers 216 may be formed along each of the gates 110-115. The sidewall spacers 216 may include a dielectric material such as silicon oxide, silicon nitride, silicon carbide, silicon oxynitride, or combinations thereof. The sidewall spacers 216 may also include multiple layers. Typical formation methods for the sidewall spacers 216 include depositing a dielectric material over each of the gates 110-115. The dielectric material may be then anisotropically etched back. The etching back process may include a multiple-step etching to gain etch selectivity, flexibility and desired over-etch control. In some examples, one or more material layers (not shown), e.g., an interfacial layer, may also be formed between the gate and the corresponding sidewall spacers. The one or more material layers may include an interfacial layer and/or a high-k dielectric layer.

Still referring to FIG. 1B, one or more source/drain features 208 may be formed on the substrate 202. In some embodiments, the formation processes of the one or more source/drain features 208 may include recessing to form source/drain trenches, and depositing to form the one or more source/drain features 208 in the source/drain trenches. In some examples, the one or more source/drain features 208 may be formed by epitaxially growing a semiconductor material layer in the source/drain recessing trenches. The one or more source/drain features 208 may be in-situ doped during the epitaxial process. For example, the epitaxially grown SiGe source/drain features may be doped with boron; and the epitaxially grown Si epitaxial source/drain features may be doped with carbon to form silicon:carbon (Si:C) source/drain features, phosphorous to form silicon:phosphor (Si:P) source/drain features, or both carbon and phosphorous to form silicon carbon phosphor (SiCP) source/drain features. In some embodiments, an implantation process (i.e., a junction implant process) may be performed to dope the source/drain features. One or more annealing processes may be performed to activate source/drain epitaxial feature. The annealing processes may comprise rapid thermal annealing (RTA) and/or laser annealing processes. In some embodiments, a source/drain feature is a source region, and the other source/drain feature is a drain region. The adjacent source/drain features 208 are separated by a gate, such as a corresponding gate of the gates 110-115 as shown in FIGS. 1A-1B. As shown in FIG. 1B, one or more contacts 120-126 are formed on the one or more source/drain features 208.

Figure 1E:
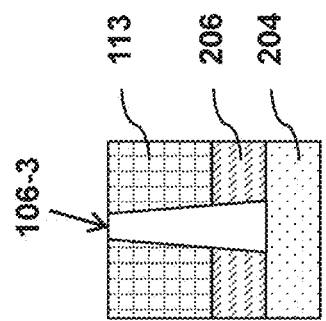
FIGS. 1E, 2C, 3D, 4D, and 5E are cross sectional views of the highlighted structure of the FinFET device along the line B-B in FIGS. 1C, 2A, 3B, 4B, and 5C according to some embodiments of the present disclosure.
Figure 1D:
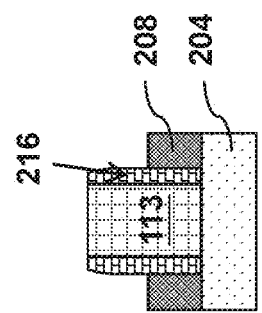
FIGS. 1D, 2B, 3C, 4C, and 5D are cross sectional views of the highlighted structure of the FinFET device along the line A-A in FIGS. 1C, 2A, 3B, 4B, and 5C according to some embodiments of the present disclosure.
Figure 1C:
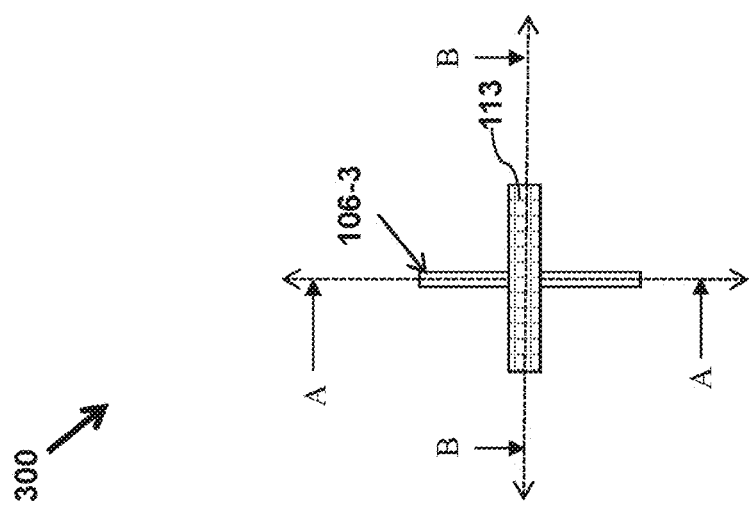
FIGS. 1C, 2A, 3B, 4B, and 5C are enlarged top views of the highlighted structure of the FinFET device in FIGS. 1A, 3A, 4A, and 5A according to some embodiments of the present disclosure.

For further clarification, FIG. 1C shows an enlarged top view of the highlighted structure 300 of the FinFET device in FIGS. 1A-1B according to some embodiments of the present disclosure. As shown in FIG. 1C, a gate dummy polygate 113 is formed on the active fin line 106-3. FIG. 1D is a cross sectional view of the structure 300 along the line A-A in FIG. 1C according to some embodiments of the present disclosure. FIG. 1E is a cross sectional view of the structure 300 along the line B-B in FIG. 1C according to some embodiments of the present disclosure.

Figure 2C:
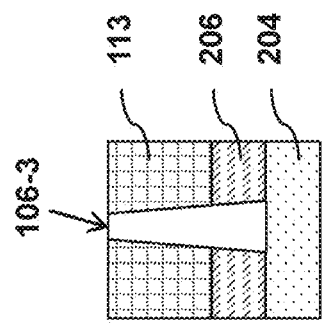
Figure 2B:
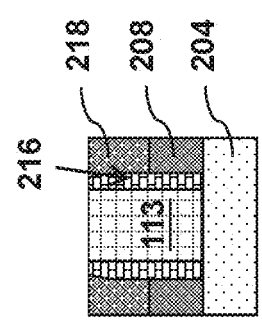
Figure 2A:
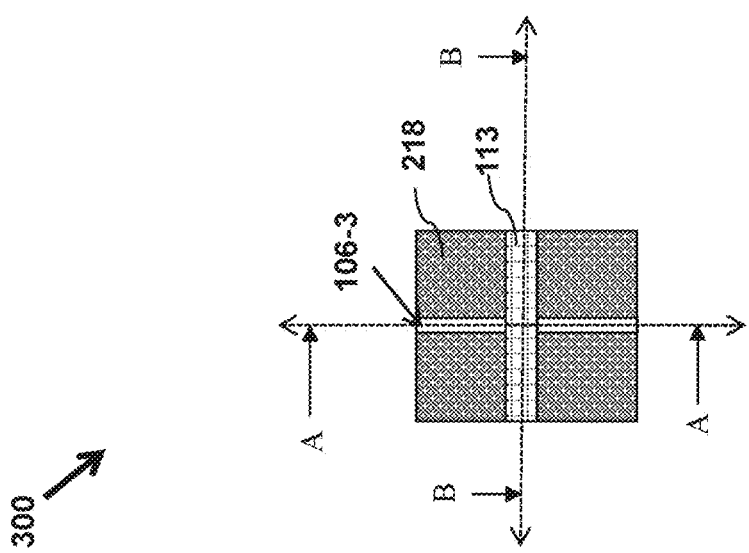

According to some embodiments of the present disclosure, an interlayer dielectric (ILD) layer 218 may be formed on the source/drain features 208 as shown in FIGS. 2A-2C. The ILD layer 218 may include silicon oxide, silicon oxynitride, or other suitable dielectric materials. The ILD layer 218 may include a single layer or multiple layers. The ILD layer 218 may be formed by a suitable technique, such as CVD, ALD, and spin-on dielectric, such as spin-on glass (SOG). After forming the ILD layer 218, a chemical mechanical polishing (CMP) process may be performed to remove excessive ILD layer 218 and planarized the top surface of the ILD layer 218.

Figure 3A:
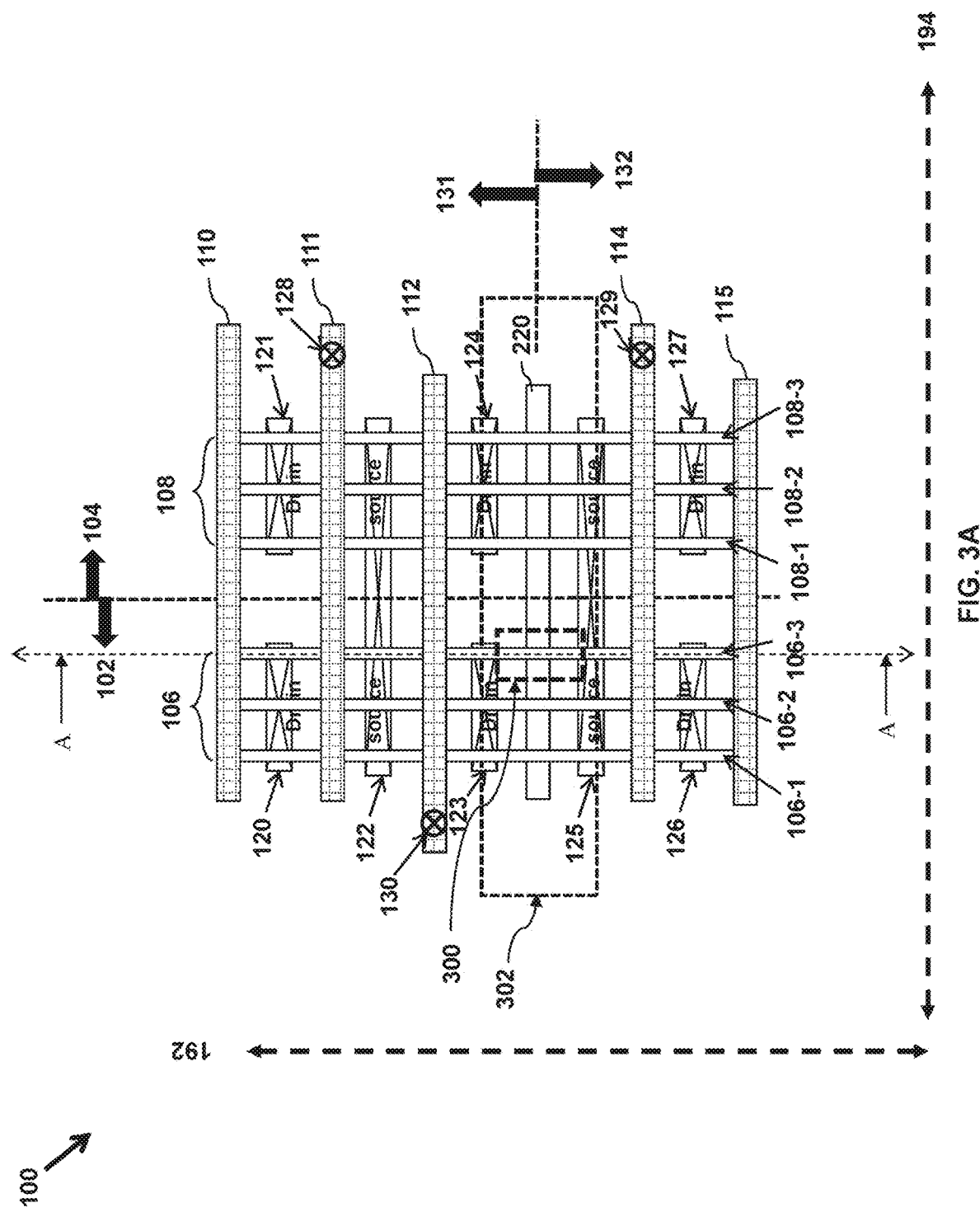
Figure 3D:
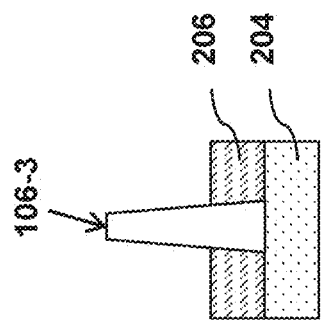
Figure 3C:
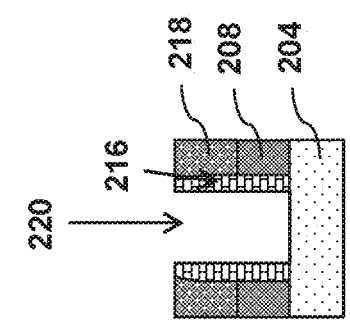
Figure 3B:
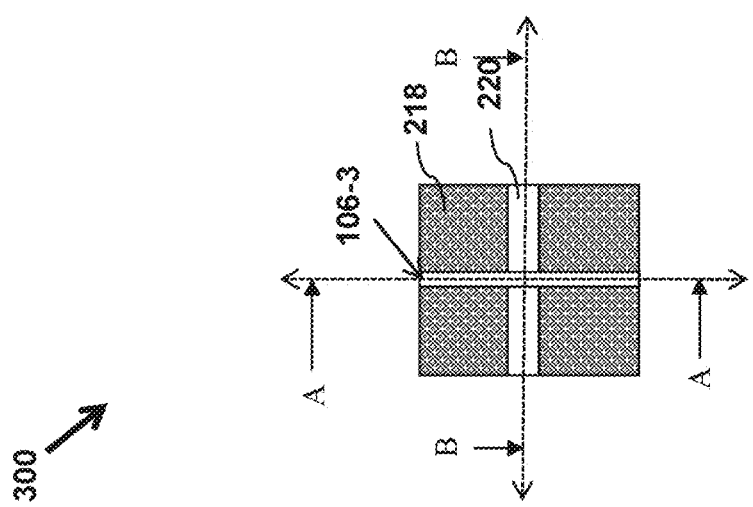

Referring to FIGS. 3A-3D, a dummy polygate 113 for isolating the first circuit 131 and the second circuit 132 is removed to form a trench 220. The dummy polygate 113 may be removed using any appropriate lithography and etching processes. The etching processes may include selective wet etch or selective dry etch, such that the dummy polygate 113 has an adequate etch selectivity with respect to the doped region 204. After removing the dummy polygate 113, one or more active fin lines in the first active region 106 and the second active region 108 are revealed. In some embodiments, the lithography process may include forming a photoresist layer (resist), exposing the resist to a pattern, performing a post-exposure bake process, and developing the resist to form a masking element including the resist. As shown in FIG. 3A, the masking element may be used to expose a region 302 including the dummy polygate 113 by any appropriate dry etching and/or wet etching method.

Figure 4A:
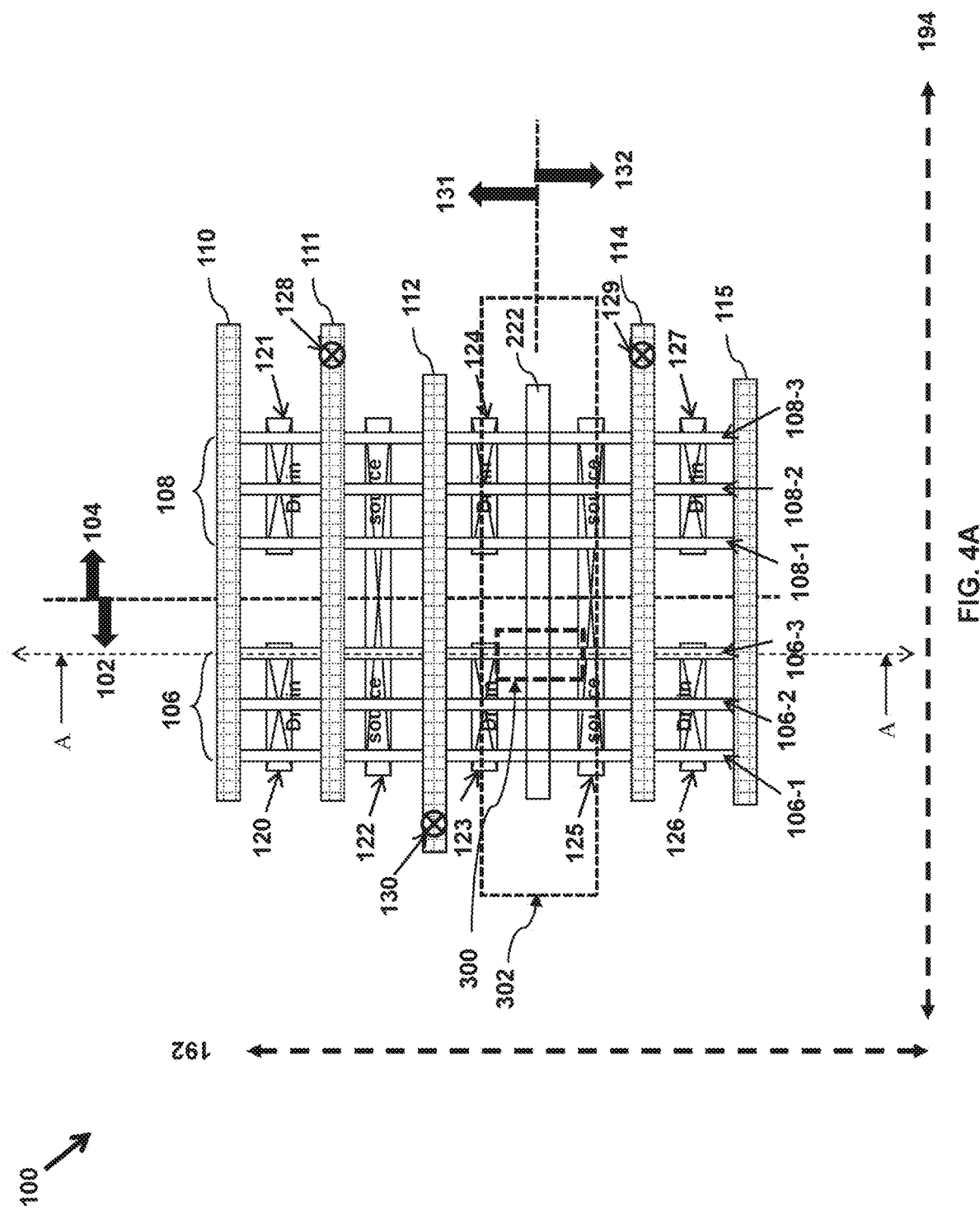
Figure 4D:
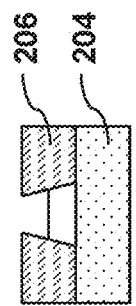
Figure 4C:
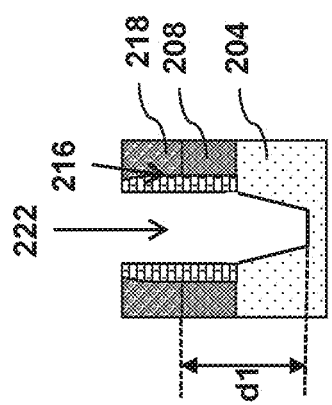
Figure 4B:
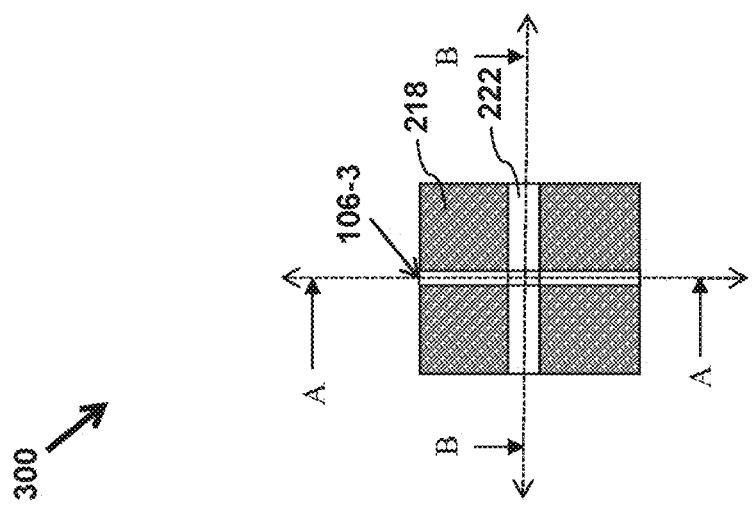

Referring to FIGS. 4A-4D, the ILD layer 218 may be used as mask elements to further recess the trench 220 within the region 302 to form a trench 222. In some embodiments, the remained spacer sidewalls 216 may also be used as mask elements to recess the trench 220. This may be regarded as a self-aligned etching process. In some embodiments, the trench formed using the self-aligned process is a V-shaped trench 222 as shown in FIG. 4C. A portion of the active fin line 106-3 exposed in the trench 220 is removed as shown in FIGS. 4A-4B. As shown in FIG. 4C, a depth (d1) between a top surface of the source/drain features 208 and a bottom of the recessed V-shaped trench 222 may be in a range from about 50 nm to about 200 nm. In the present embodiment, a mask element with an exposed area substantially larger than the area of the dummy polygate may be used to etch the substrate to form the trench. For example, the area of the exposed region 302 of FIGS. 1A, 3A, and/or 4A is substantially greater than the area of the dummy polygate 113 and/or the trench 220. This may provide a lithography friendly process.

Figure 5A:
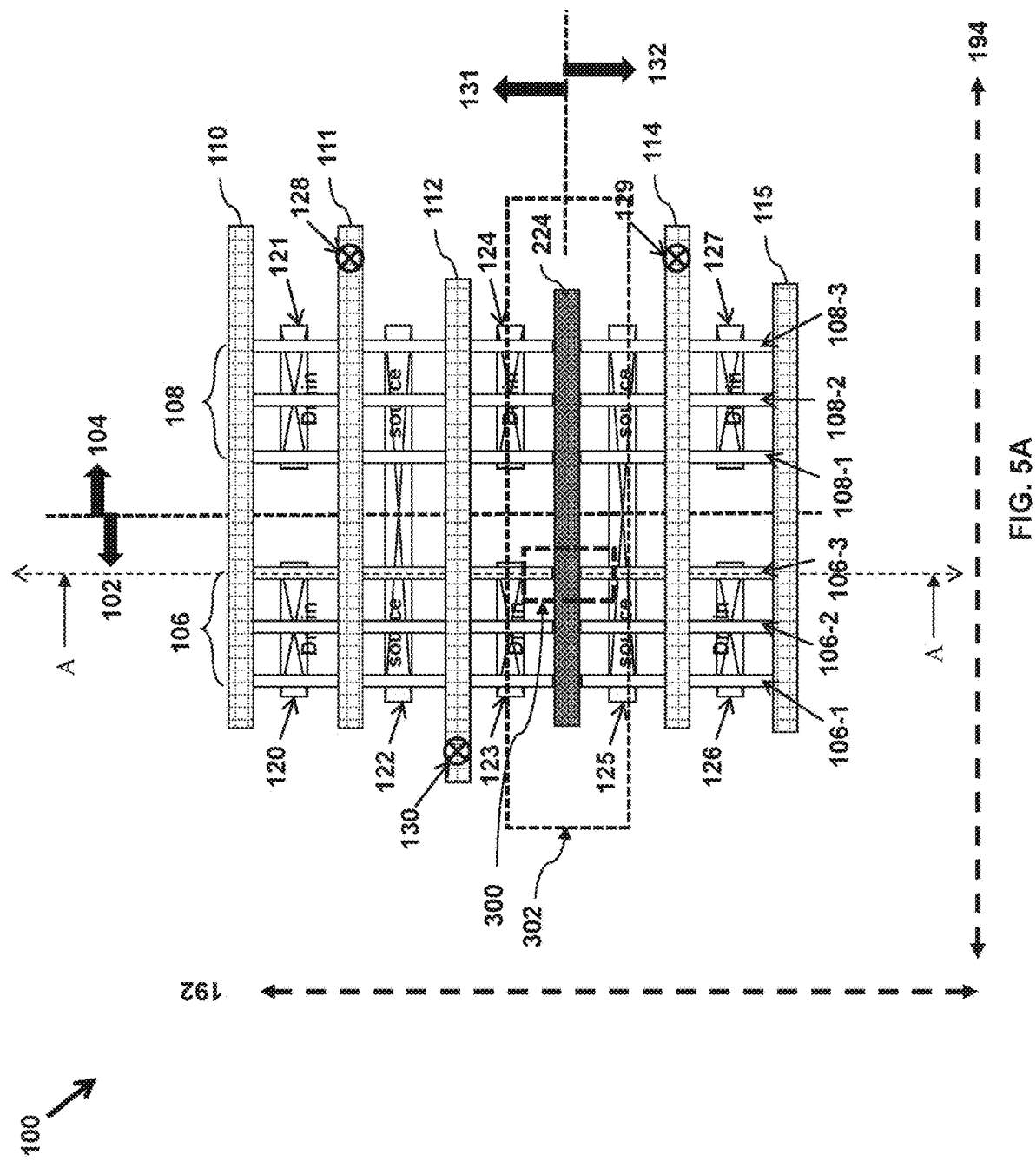
Figure 5B:
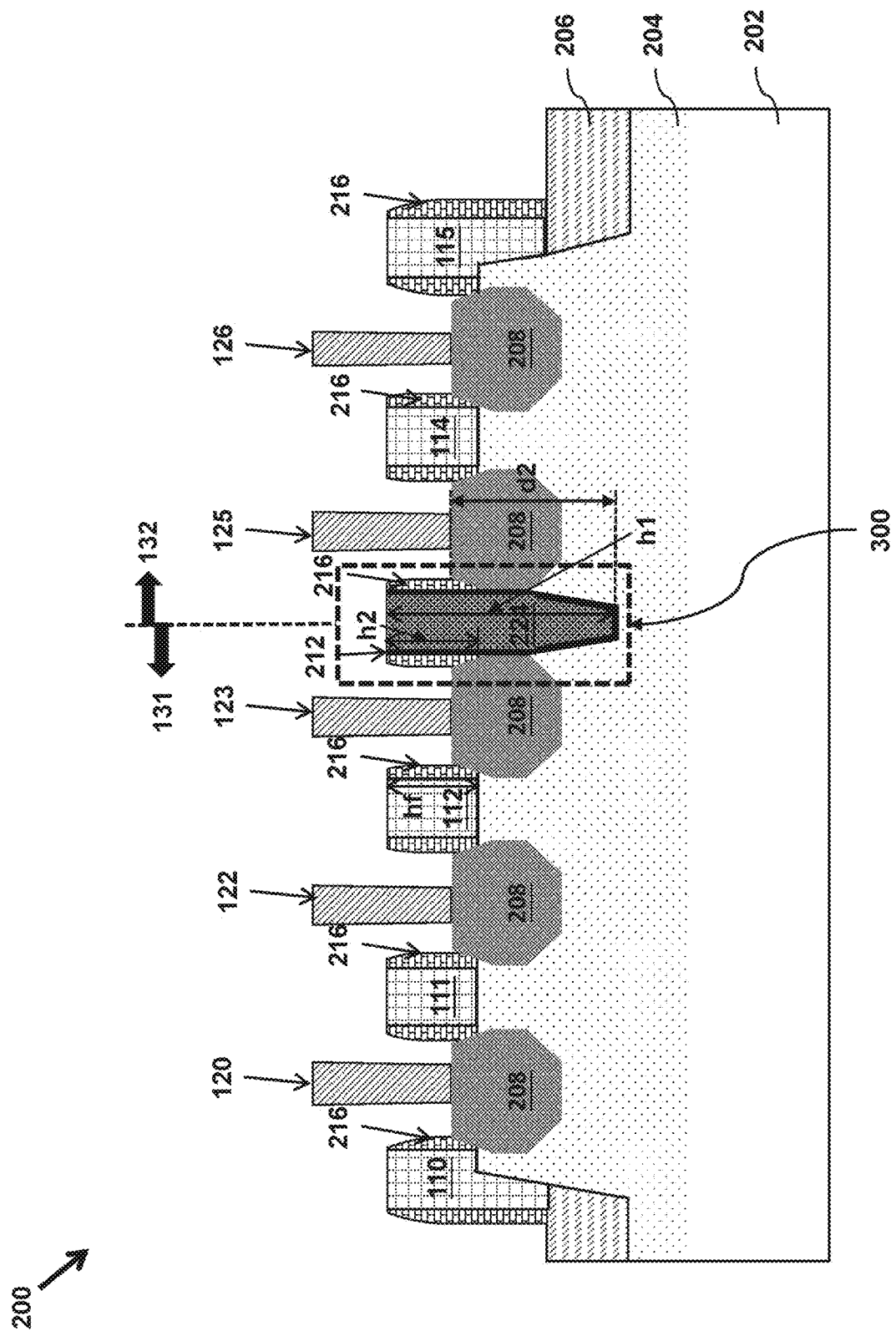
Figure 5E:
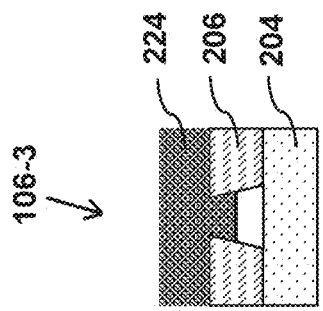
Figure 5D:
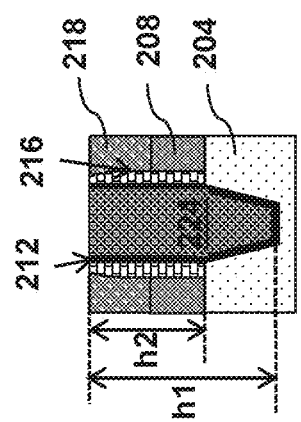
Figure 5C:
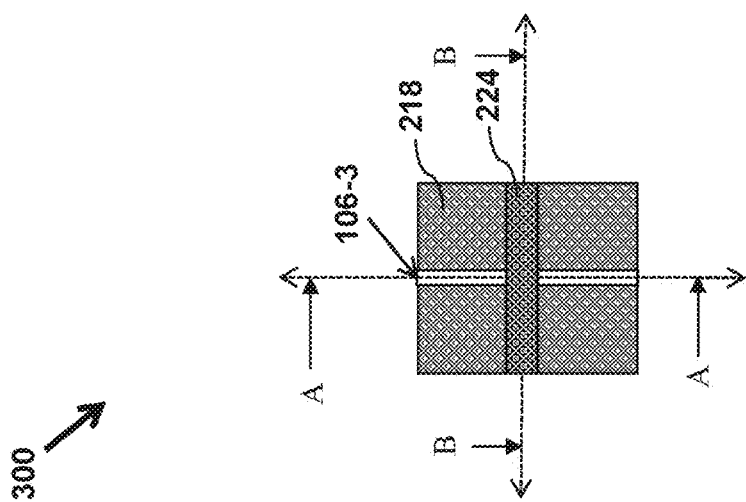

Referring to FIGS. 5A-5D, one or more material layers 224 may be deposited in the trench 222 to form an isolation gate 224. The isolation gate 224 may include a V-shaped bottom conformed to the V-shaped trench 222 as shown in FIGS. 5B and 5D. As shown in FIG. 5B, a depth (d2) between a top surface of the source/drain features 208 and a bottom of the isolation gate 224 may be in a range from about 50 nm to about 200 nm. In some embodiments as shown in FIGS. 5B and 5D, the one or more material layers deposited in the trench 222 may include a dielectric layer 212 and a material layer 224. In some embodiments, the dielectric layer 212 may include an interfacial layer (IL) and/or a high-k (HK) dielectric layer formed in the trench 222 and conformed to the surfaces of the trench 222. The IL layer may be deposited by any appropriate method, such as ALD, CVD, and/or PVD. The IL layer may include silicon oxide (SiO2), or silicon oxynitride (SiON). The HK dielectric layer may be deposited over the IL layer by any suitable techniques, such as ALD, CVD, metal-organic CVD, PVD, or a combination thereof. The HK dielectric layer may include one or more material selected from the group consisting of HfO2, Ta2O5, and Al2O3, and/or other suitable materials.

Still referring to FIGS. 5A-5E, the material layer 224 may include one or more metal gate (MG) layers, such as work function metal layer, low resistance metal layer, liner layer, wetting layer, and/or adhesion layer. In some embodiments, the work function metal layer may include one or more materials selected from the group consisting of Tin, TaN, TiAl, TaAl, Ti-included materials, Ta-included materials, Al-included materials, W-included materials, TiSi, NiSi, and PtSi. In some embodiments, the low resistance metal layer may include one or more materials selected from the group consisting of poly Si with silicide, Al-included materials, Cu-included materials, W-included materials, Ti-included materials, Ta-included materials, TiN, TaN, TiW, and TiAl. The MG layer may be formed by ALD, PVD, CVD, or other suitable process. A CMP process may be performed to remove excessive MG layer and provide a substantially planar top surface for the ILD layer 218 and the material layer 224. The device work function determined by the work function metal layer may be in a range from about 4 eV to about 5 eV. The dielectric layer 212 is formed to provide sufficient insulating property to the material layer 224 filled in the trench 222. After forming the dielectric layer 212 and the material layer 224 in the trench 222, the circuit 131 and the circuit 132 may be sufficiently electrically isolated from each other.

In some embodiments, the materials, formation, and layout of the dielectric layer 212 and/or the material layer 224 may also be designed such that, a controlled bias voltage may be applied to the isolation gate 224 for effective isolation between the circuit 131 and the circuit 132.

In some embodiments, the trench 222 may also be filled by a dielectric layer. The dielectric layer may be formed using similar method(s) and/or similar material(s) as those for the dielectric layer 212 as discussed previously. For example, the dielectric layer may include one or more materials selected from the group consisting of LaO, AlO, ZrO, TiO, $Ta_2O_5$, $Y_2O_3$, $SrTiO_3$ (STO), $HfO_2$, $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, and silicon oxynitride (SiON). The dielectric layer used to fill the trench 222 may include any suitable materials, such as silicon oxide, silicon nitride, silicon carbide, and/or silicon oxynitride. In some examples, the dielectric layer may be deposited to fully fill the trench 222 to provide sufficient electrical isolation property. In some embodiments when the isolation gate 224 includes a dielectric material filled in the trench 222, the dielectric material used to fill in the trench 222 is different from the materials used to form the sidewall spacers 216 formed along the isolation gate 224. In some examples, the dielectric layer may partially fill the trench 222. For example a lower portion of the trench 222 may be filled by the dielectric layer, and an upper portion of the trench 222 may be filled by the dielectric layer 212 and the material layer 224. The dielectric layer filled in the lower portion of the trench 222 may have similar function(s) as that of the isolation region (STI) to separate the circuit 131 and the circuit 132. The dielectric layer may be formed by ALD, PVD, CVD, or other suitable process.

Referring to FIG. 5A, after forming the isolation gate 224, the FinFET device 200 includes an isolation gate 224 configured to separate the circuit 131 and the circuit 132. The gates 110, 111, 112, 114, and 115 are functional gates including functional metal gates. In some embodiments, the functional gates may include materials different from the materials in the isolate gate. As shown in FIGS. 5B and 5D, a height (h1) of the isolation gate 224 is substantially greater than a height (h2) of each of the sidewall spacers 216 formed along the isolation gate 224. The height (h1) of the isolation gate 224 is also substantially greater than the height (hf) of the functional gates. In addition, the isolation gate 224 extends into the doped regions 204 and has a bottom lower than that of the functional gates 110, 111, 112, 14, and 115. The material of the isolation gate 224 can be same material as functional gates, or have different material. Example materials include a purely dielectric material such as SiO2, SiON, Si3N4, high-K dielectric, or a combination thereof in the isolation gate 224. In this example, the process flow will be:

1. isolation gate poly removing and trench etch,
2. dielectric deposition (re-fill the isolation gate), and
3. functional gate formation (which may further include removing the poly gate, high-K gate dielectric, work-function metal, and the low resistance metal formation.)

Figure 6B:
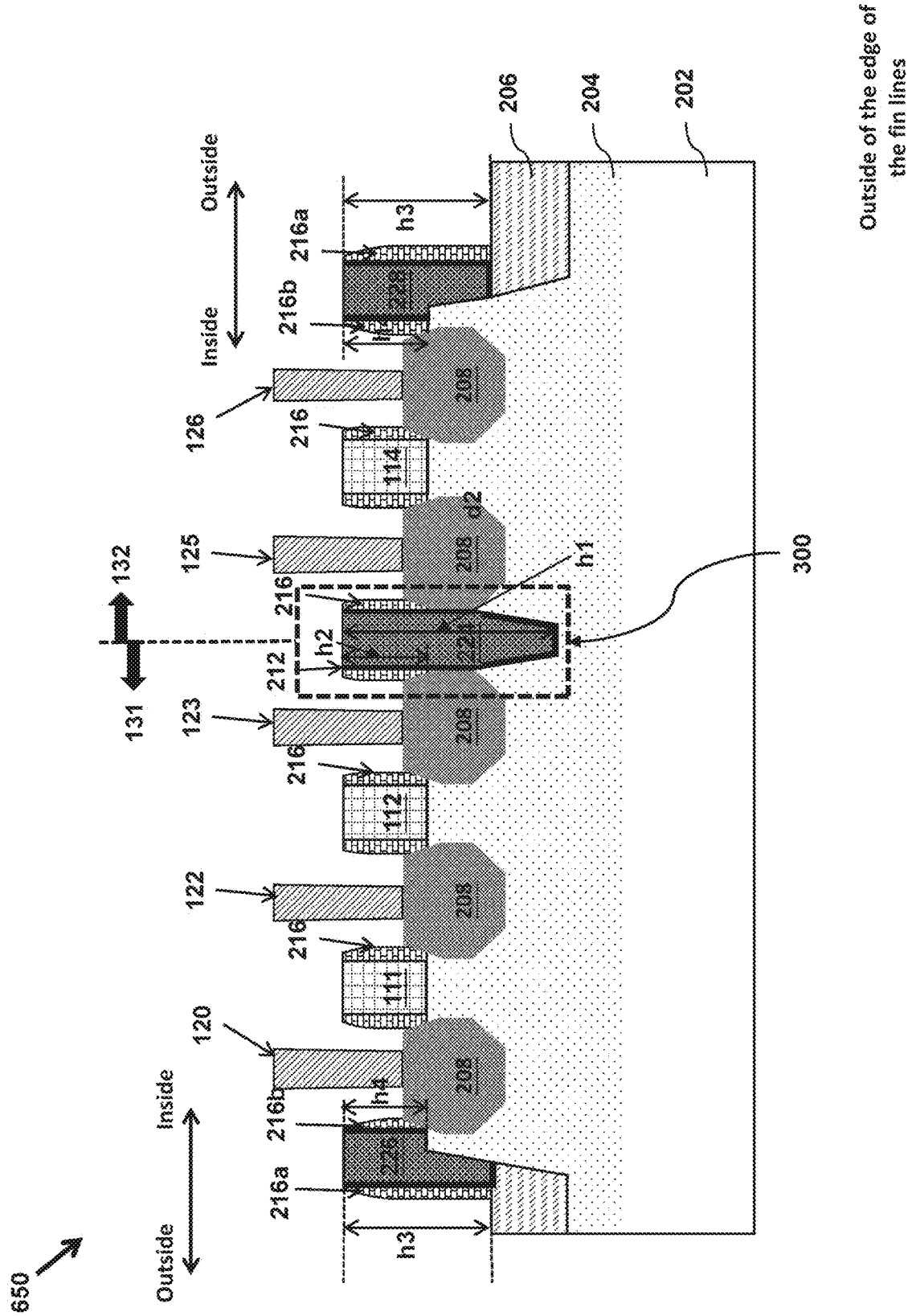

FIG. 6A is a top view of a design layout 400 of the FinFET device constructed according to some embodiments of the present disclosure. FIG. 6B is a cross sectional view of the FinFET device 650 along the line A-A in FIG. 6A according to some embodiments of the present disclosure. In some embodiments, the one or more gates located at the edges of the active fin lines, e.g., gate 110 and/or gate 115 of FIG. 1A, may also be removed and the corresponding one or more trenches may be formed using the ILD layer and/or spacer sidewalls on the sides of the gates as mask elements. Dielectric materials, or dielectric materials and metal materials may be used to fill the one or more trenches to form the isolation gates, such as gate 226 and/or gate 228 located at the edge of the active fin lines. The formation processes and/or materials of the isolation gates 226 and/or 228 may be substantially similar to the formation processes and/or materials of the isolation gate 224 as discussed previously. As shown in FIG. 6A, the formation process of the isolation gate 226 at the edge of the active fin lines may include using a mask having an area of the exposed region 304 substantially greater than the area of the gate 110. Similarly, the formation process of the isolation gate 228 at the edge of the active fin lines may also include using a mask having an area of the exposed region 306 substantially greater than the area of the gate 115.

Referring to FIGS. 6A-6B, the FinFET device 650 includes an isolation gate 224 configured to separate the circuit 131 and the circuit 132, and isolation gates 226 and 228 configured to be at the edges of the active fin lines. The gates 111, 112, and 114 are functional gates including functional metal gates. In some embodiments as shown in FIG. 6B, a height (h1) of the isolation gate 224 is substantially greater than a height (h2) of each of the sidewall spacers 216 formed along the isolation gate 224. The sidewall spacers 216 and the isolation gates 226 and 228 located at the edges of the active fin lines may have asymmetric structures as shown in FIG. 6B. For example, sidewall spacer 216a formed on outside of the isolation gate 226 or 228, and an outside portion of the isolation gate 226 or 228 may have a height (h3), sidewall spacer 216b formed on inside of the isolation gate 226 or 228, and an inside portion of the isolation gate 226 or 228 may have a height (h4), and the height h3 is substantially greater than the height h4. In addition, the isolation gate 226 or 228 may have a bottom lower than the bottom of the functional gates 111, 114, and higher than the bottom of the isolation gate 224.

FIG. 7 is a flow chart of an example method 500 for fabricating the FinFET device according to various aspects of the present disclosure. Method 500 includes a process 502 for providing a MOSFET device precursor, a process 504 for depositing an ILD layer over the source/drain features, a process 506 for removing the dummy polygate between the adjacent circuits to form a trench, a process 508 for recessing the trench using the ILD layer as mask elements, and a process 510 for depositing one or more material layers to form an isolation gate. It should be understood that additional processes may be provided before, during, and after the method 500 of FIG. 7, and that some other processes may be briefly described herein.

At process 502, the MOSFET device precursor, e.g., the FinFET device precursor 200 is provided. In some embodiments, the MOSFET device precursor includes a substrate, and one or more fins formed in a first active region and a second active region over the substrate. The one or more fins may be separated by one or more isolation regions. One or more gates may be formed over the one or more fins and extending over the first active region and the second active region. The one or more gates may be formed to extend along a direction that is substantially perpendicular to a direction along which the one or more fins may be formed to extend. Source/drain features may be formed in source/drain regions of the MOSFET device precursor.

At process 504, an ILD layer is deposited over the surfaces of each of the fins. The ILD layer may include silicon oxide, silicon oxynitride, or other suitable dielectric materials. The ILD layer may include a single layer or multiple layers. The ILD layer may be formed by a suitable technique, such as CVD, ALD, and spin-on dielectric, such as SOG. A CMP process may be performed to provide a planar top surface of the ILD layer.

At process 506, a dummy polygate may be removed to form a trench disposed between two adjacent circuits. The dummy polygate may be removed using any appropriate lithography and etching processes. The etching processes may include selective wet etch or selective dry etch. After removing the dummy polygate, one or more active fin lines in the active regions are revealed. In some embodiments, the lithography process may include forming a photoresist layer (resist), exposing the resist to a pattern, performing a post-exposure bake process, and developing the resist to form a masking element including the resist. As shown in FIG. 3A, a masking element may be used to expose a region 302 including the dummy polygate 113 by any appropriate dry etching and/or wet etching method. The mask element may have an area substantially greater than the area of the dummy polygate.

At process 508, the trench may be further recessed using the ILD layer as etching mask elements. The remained spacer sidewalls may also be used as mask elements to recess the trench. For example as shown in FIGS. 4A-4B, a portion of the active fin line 106-3 exposed in the trench 220 is removed. In the present embodiment, the mask element with an exposed area substantially greater than the area of the dummy polygate may be used to etch the substrate to form the trench.

At process 510, one or more material layers may be deposited in the recessed trench to form an isolation gate between the two adjacent circuits. In some embodiments, the isolation gate may include a multiple layered structure of IL/HK/MG. In some embodiments, the isolation gate may include a dielectric material fully filled in the recessed trench. In some embodiments, the isolation gate may include a dielectric material filling a lower portion of the recessed trench, and an IL/HK/MG structure filling an upper portion of the recessed trench. The isolation gate may be formed to electrically isolate the two adjacent circuits. The one or more material layers may be formed using ALD, PVD, CVD, or other suitable process.

It is understood, however, that the present disclosure should not be limited to a particular type of device, except as specifically claimed. For example, the present disclosure is also applicable to other MOSFET device. It is also understood that additional steps can be provided before, during, and after the method, and some of the steps described can be replaced or eliminated for other embodiments of the method.

The present embodiments describe structures and methods for forming MOSFET devices using a self-aligned etching process to form an isolation gate for sufficient electrical isolation between adjacent transistors. The mechanisms involve using the remained ILD layer and the spacer sidewalls as etching mask elements to form a trench in the MOSFET device. One or more materials layers may then be deposited to fill the trench to provide sufficient electrical isolation between adjacent circuits. The mechanisms provide a lithography friendly patterning process with improved overlay control without using advanced lithography tools. Thus, no extra cost or area penalty is needed in the present embodiments. The mechanisms may also provide a fully balance source/drain epitaxial growth environment, which may improve device stability, chip speed, cell matching performance, and reduce standby specification. The various embodiments of the present disclosure may achieve an improved uniformity control on source/drain regions, and a fully uniform fin-end allocation for both reliability and process margin improvement.

The present disclosure provides a semiconductor structure comprising one or more fins formed on a substrate and extending along a first direction; one or more gates formed on the one or more fins and extending along a second direction substantially perpendicular to the first direction, the one or more gates including an first isolation gate and at least one functional gate; source/drain features formed on two sides of each of the one or more gates; an interlayer dielectric (ILD) layer formed on the source/drain features and forming a coplanar top surface with the first isolation gate. A first height of the first isolation gate is greater than a second height of each of the at least one functional gate.

The present disclosure provides a fin-like field-effect transistor (FinFET) device comprising a substrate including a first active region and a second active region spaced apart from each other in a first direction; a first group of fins configured in the first active region, and a second group of fins configured in the second active region, each of the first group of fins and the second group of fins extending along a second direction substantially perpendicular to the first direction; one or more gates configured to extend over the first active region and the second active region along the first direction, the one or more gates including a first isolation gate and at least one functional gate; sidewall spacers formed on sides of the one or more gates; source/drain features formed on sides of the sidewall spacers; an interlayer dielectric (ILD) layer formed on the source/drain features and forming a coplanar top surface with the one or more gates. A first height of the first isolation gate is substantially greater than a second height of sidewall spacers formed on sides of the first isolation gate.

The present disclosure provides a method of forming a semiconductor device comprises providing a device precursor including a substrate including a first active region and a second active region spaced apart from each other in a first direction; a first group of fins configured in the first active region, and a second group of fins configured in the second active region, each of the first group of fins and the second group of fins extending along a second direction substantially perpendicular to the first direction; and one or more gates including a polygate configured to extend over the first active region and the second active region, each of the one or more gates extending along the first direction. The polygate is configured to separate a first circuit and a second circuit. The method further comprises depositing an interlayer dielectric (ILD) layer over the substrate; removing the polygate to form a trench; recessing the trench to the substrate using the ILD layer as etching mask elements; and depositing one or more material layers in the recessed trench to form an isolation gate between the first circuit and the second circuit.

The present disclosure provides a method of forming a semiconductor device comprising forming a first group of fins in an n-well region and a second group of fins in a p-well region on a substrate; forming one or more isolation features to separate adjacent fins of the first group of fins and the second group of fins; forming one or more gates including a polygate on the first group of fins and the second group of fins, the polygate configured to separate a first circuit and a second circuit; forming sidewall spacers along the polygate; forming source/drain features on the substrate and on two sides of the polygate; depositing an interlayer dielectric (ILD) layer on the source/drain features; removing the polygate to form a trench between the first circuit and the second circuit; recessing the trench using the ILD layer as etching mask elements to a depth lower than bottoms of the source/drain features to form a V-shaped trench; and depositing one or more material layers in the V-shaped trench to form an isolation gate between the first circuit and the second circuit.

In some embodiments, the recessing the trench further comprises: using the ILD layers and the sidewall spacers along the polygate as etching mask elements.

In some embodiments, the depositing the one or more material layers includes depositing interfacial layer (IL)/high-k (HK) dielectric layer/metal gate (MG) in the V-shaped trench.

In some embodiments, the depositing the one or more material layers includes depositing a dielectric layer in the V-shaped trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a fin structure disposed over a substrate;
an isolation gate and a first gate structure disposed over the fin structure;
a first sidewall spacer disposed along the isolation gate; and
a source/drain feature disposed in the substrate adjacent the isolation gate, and wherein the isolation gate includes a dielectric layer and a metal gate layer, the dielectric layer conformed to a side surface of the first sidewall spacer and extending along the first sidewall spacer and into the substrate such that the dielectric layer physically contacts the first sidewall spacer, the source/drain feature, and the substrate, the metal gate layer extending into the substrate to a first depth and the source/drain feature extending into the substrate to a second depth, the first depth being greater than the second depth.

2. The device of claim 1, further comprising a shallow trench isolation structure disposed over the substrate, and wherein the first gate structure is disposed over the shallow trench isolation structure.

3. The device of claim 2, wherein the shallow trench isolation structure physically contacts the fin structure.

4. The device of claim 3, further comprising:
a second sidewall spacer disposed along a first sidewall of the first gate structure and physically contacting the fin structure; and
a third sidewall spacer disposed along a second sidewall of the first gate structure and physically contacting the shallow trench isolation structure, the third sidewall spacer opposing the second sidewall spacer.

5. The device of claim 1, further comprising a second gate structure disposed on a first side of the isolation gate,
wherein the first gate structure is disposed on a second side of the isolation gate,
wherein the first gate structure is part of a first circuit and the second gate structure is part of a second circuit, and
wherein the isolation gate isolates the first circuit from the second circuit.

6. The device of claim 1, further comprising a doped region disposed within the substrate beneath the source/drain feature, and
wherein the isolation gate extends into the doped region.

7. The device of claim 1, wherein the dielectric layer includes a high-k dielectric material.

8. A device comprising:
a semiconductor fin structure disposed over a substrate;
a first functional gate, a first isolation gate and second isolation gate disposed over the semiconductor fin structure, wherein the first functional gate is disposed between the first isolation gate and the second isolation gate;
a first sidewall spacer disposed along the first isolation gate;
a first source/drain feature disposed on a side of the first sidewall spacer and extending into the substrate to a first depth; and
wherein the first isolation gate includes a dielectric layer and a conductive layer, the dielectric layer conformed to a surface of the first sidewall spacer and extending along the first sidewall spacer and into the substrate such that the dielectric layer physically contacts a side surface of the first sidewall spacer, the first source/drain feature, and the substrate, the conductive layer extending into the substrate to a second depth that is greater than the first depth.

9. The device of claim 8, wherein the first functional gate and the first isolation gate share the first source/drain feature.

10. The device of claim 8, further comprising a second functional gate disposed between the first isolation gate and the second isolation gate, and
a second source/drain feature disposed in the substrate between the first functional gate and the second functional gate.

11. The device of claim 8, further comprising a shallow trench isolation structure disposed in the substrate, and
wherein the second isolation gate includes a first portion physically contacting the shallow trench isolation structure.

12. The device of claim 8, wherein the second isolation gate includes a second portion physically contacting the semiconductor fin structure.

13. The device of claim 8, wherein the second isolation gate extends along an edge of the semiconductor fin structure to a third depth, the third depth being less than the second depth.

14. The device of claim 13, wherein the third depth is less than the first depth.

15. A device comprising:
a semiconductor fin structure disposed over a substrate;
a functional gate, a first isolation gate and second isolation gate disposed over the semiconductor fin structure, wherein the functional gate is disposed between the first isolation gate and the second isolation gate;
a first source/drain feature associated with the first isolation gate and extending into the substrate to a first depth; and
wherein the first isolation gate includes a dielectric layer and a conductive layer, the dielectric layer extending into the substrate such that the dielectric layer physically contacts the first source/drain feature and the substrate, the conductive layer extending into the substrate to a second depth that is greater than the first depth and the second isolation gate extending into the substrate to a third depth that is different than the first depth and the second depth.

16. The device of claim 15, wherein the second isolation gate extending into the substrate to the third depth includes the second isolation gate extending along an edge of the semiconductor fin structure to the third depth, and wherein the third depth is less than the first depth and the second depth.

17. The device of claim 15, further a shallow trench isolation structure disposed in the substrate, and
wherein the second isolation gate extends to the shallow trench isolation structure.

18. The device of claim 17, further comprising a doped region disposed in the substrate below the first source/drain feature, the doped region extends continuously from under the first source/drain feature to the shallow trench isolation structure such that a portion of the doped region is disposed under the shallow trench isolation structure.

19. The device of claim 18, further comprising a second source/drain feature disposed in the substrate, and
wherein the second source/drain feature has an edge facing the second isolation gate and a portion of the doped region extends from the edge to the second isolation gate.

20. The device of claim 15, wherein the dielectric layer includes a high-k dielectric material, and
wherein the conductive layer includes a metal material.

* * * * *